US010554449B1

United States Patent
Ghittori et al.

(10) Patent No.: US 10,554,449 B1
(45) Date of Patent: Feb. 4, 2020

(54) BASELINE WANDER COMPENSATION IN SERDES TRANSCEIVERS

(71) Applicant: eSilicon Corporation, San Jose, CA (US)

(72) Inventors: Nicola Ghittori, Pavia (IT); Claudio Nani, Milan (IT); Giovanni Cesura, Cremona (IT)

(73) Assignee: eSilicon Corporation, San Jose, CA (US)

( * ) Notice: Subject to any disclaimer, the term of this patent is extended or adjusted under 35 U.S.C. 154(b) by 0 days.

(21) Appl. No.: 16/270,512

(22) Filed: Feb. 7, 2019

(51) Int. Cl.
| | |
|---|---|
| *H04L 25/06* | (2006.01) |
| *H04L 25/02* | (2006.01) |
| *H03M 9/00* | (2006.01) |
| *H04L 25/03* | (2006.01) |
| *H04L 27/00* | (2006.01) |
| *H03M 1/06* | (2006.01) |

(52) U.S. Cl.
CPC ...... *H04L 25/0272* (2013.01); *H03M 1/0626* (2013.01); *H03M 9/00* (2013.01); *H04L 25/03057* (2013.01); *H04L 27/0002* (2013.01)

(58) Field of Classification Search
CPC .......... H04L 25/0272; H04L 25/03057; H04L 27/0002; H03M 1/0626; H03M 9/00
USPC ....... 375/219, 285, 295, 296, 316, 317, 318, 375/319, 232
See application file for complete search history.

(56) References Cited

U.S. PATENT DOCUMENTS

| | | | | |
|---|---|---|---|---|
| 4,625,320 | A * | 11/1986 | Butcher | H04L 25/061 327/165 |
| 5,940,442 | A * | 8/1999 | Wong | H04L 25/062 375/232 |
| 8,098,768 | B2 * | 1/2012 | Langner | H04B 3/06 375/257 |
| 8,472,563 | B2 * | 6/2013 | Esumi | H03K 5/082 375/219 |
| 2006/0022847 | A1 * | 2/2006 | Lee | G11B 20/1426 341/50 |
| 2008/0063091 | A1 * | 3/2008 | Dong | H04L 25/0276 375/257 |

* cited by examiner

*Primary Examiner* — Tesfaldet Bocure
(74) *Attorney, Agent, or Firm* — Fenwick & West LLP

(57) ABSTRACT

A transceiver system compensates for baseline wandering in an analog signal in the analog stage before sampling the analog signal and processing the analog signal in the digital stage. The transceiver system includes an analog to digital converter that samples the analog signal after baseline wandering compensation, a digital equalizer to condition the digital samples, and the slicer to determine transmitted symbols from the digital samples. The transceiver system includes a subtraction block that determines the difference between an input and an output of the slicer, a digital to analog converter that converts a difference between the input and the output of the slicer, a low pass filter that filters out high frequency components of the difference between the input and the output of the slicer thereby to extract out the baseline wandering, and a signal summation circuit that subtracts the baseline wandering from the analog signal.

8 Claims, 4 Drawing Sheets

BASELINE WANDER COMPENSATION IN SERDES TRANSCEIVERS

BACKGROUND

1. Field of the Disclosure

This disclosure pertains in general to transceivers, and more specifically to analog to digital converter (ADC) based Serial/Deserializer transceivers.

2. Description of the Related Art

Serial/Deserializers (SerDes's) are widely used in applications that involve gigabit rate links. Compared to parallel links, serial communication has many advantages such as no crosstalk noise, occupies less area, and consumes less power. SerDes are typically embedded inside transceiver blocks to communicate data between processors and memories. The ever-increasing data rates have made it challenging to ensure the data integrity.

SUMMARY

A transceiver system compensates for baseline wandering in the analog stage. The transceiver system removes baseline wandering from an analog signal before converting the analog signal to a digital signal for further processing. The transceiver system includes an analog to digital converter that samples the analog signal after the baseline wandering compensation, a digital equalizer to condition the digital samples, and a slicer to determine transmitted symbols from the digital samples. The described transceiver system also includes an AC coupler that couples the analog signal into the transceiver system. The transceiver system includes a subtraction block that determines the difference between an input and an output of the slicer, a digital to analog converter that converts a difference between the input and the output of the slicer, a low pass filter that filters out high frequency components of the difference between the input and the output of the slicer thereby to extract out the baseline wandering, and a signal summation circuit that subtracts the baseline wandering from the analog signal.

Other aspects include components, devices, systems, improvements, methods, processes, applications and other technologies related to the foregoing.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Figure 1:
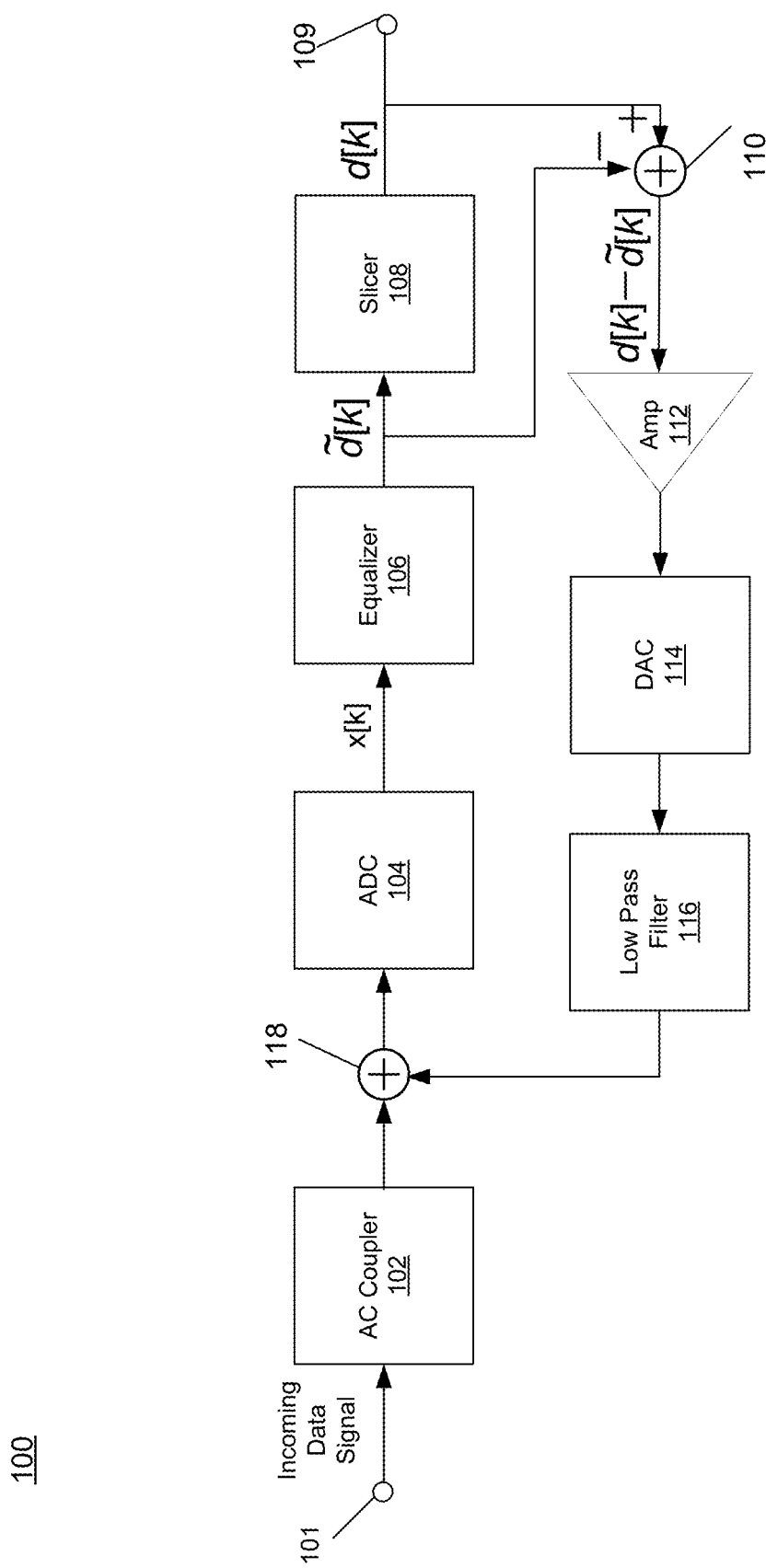
FIG. 1 is a block diagram illustrates an example transceiver system for recovering transmitted data from a received data signal, according to one embodiment.

FIG. 1 is a block diagram illustrating an example transceiver system 100 for recovering transmitted data from a received data signal, according to one embodiment. The transceiver system 100 receives an incoming data signal at its input terminal 101 and outputs symbols d[k] at its output terminal 109. The transceiver system 100 compensates for baseline wandering in the analog stage. That is, the baseline wandering is reduced or substantially removed before analog signals are converted to digital signals. Baseline wandering refers to the phenomenon of a slow-moving error signal appearing in the analog signal that is sampled. This slow-moving error signal appears because an AC coupling component (e.g., an isolation transformer, a capacitor) is used to couple the analog signal into or from a communication channel (e.g., a bus). Inevitably, the frequency response of the AC coupling component results in a variation of the frequency content of the input analog signal. This variation causes an increase in bit error rate of the receiver. The magnitude of the baseline wander error depends on the AC coupling component frequency response corner frequency as well as on the data rate and the modulation format.

The transceiver system 100 includes an AC coupler 102, an analog to digital converter (ADC) 104, an equalizer 106, a slicer 108, a subtraction block 110, a digital amplifier 112, a digital to analog converter (DAC) 114, a low pass filter 116, and a signal summation circuit 118. The transceiver system 100 receives an incoming analog signal at its input terminal 101. This analog signal suffers from channel distortion, random noise, and a flat signal loss. The AC coupler 102 couples in the analog signal into the transceiver system 100 and provides a bias point to the ADC 104. As further described below, the subtraction block 110, the digital amplifier 112, the DAC 114, the low pass filter 116, and the signal summation circuit 118 together create a baseline wandering compensation circuit that compensates for any baseline wandering present in the analog signal. The ADC 104 converts the compensated analog signal to a digital signal x[k] that is a series of samples of the compensated analog signal.

The equalizer 106 conditions the digital signal x[k] by removing the inter-symbol interference between the digital samples. The equalizer 106 outputs the filtered signal d̃[k] to the slicer 108. The filtered signal d̃[k] is an estimation of the symbols that are transmitted. The slicer 108 determines a symbol d[k] from the estimation of the symbol d̃[k]. Compared to the filtered signal d̃[k] that may be affected by the baseline wandering, the symbol d[k] represents the original transmitted signal before being high pass filtered by the AC coupler 102 and is uncorrupted by the baseline wandering. The series of symbols d[k] may be outputted from the transceiver system 100 or provided to a decoder (not shown) of the transceiver system 100.

As further described below, the subtraction block 110, the digital amplifier 112, the DAC 114, the low pass filter 116, and the signal summation circuit 118 together create a baseline wandering compensation circuit that compensates for the baseline wandering present in the incoming data signal. The subtraction block 110, the digital amplifier 112, the DAC 114, and the low pass filter 116 together determine an amount of the baseline wandering to be compensated, and the signal summation circuit 118 subtracts that amount from the incoming data signal.

The subtraction block 110 outputs an error signal that represents the difference between the input and the output of the slicer 108, i.e., the digital signals d[k] and d̃[k]. This error signal includes information representing the baseline wandering as well as other noises and distortion. The digital amplifier 112 amplifies the error signal outputted by the subtraction block 110 by a digital gain G. The DAC 114 converts the amplified error signal to an analog error signal. The low pass filter 116 outputs an analog signal representing the baseline wandering by filtering out the high frequency component from the analog error signal outputted by the DAC 114. The signal summation circuit 118 subtracts the analog signal representing the baseline wandering from the output signal of the AC coupler 102.

For the transceiver system 100 as illustrated, the loop gain, the baseline wander correction DC accuracy (Acc), and the unity gain bandwidth (UGB) can be determined according to Equations (1), (2), (3), respectively:

$$G_{loop} = \frac{G}{1 + jf/fc} \frac{V_{DAC_{FS}}}{Vin_{FS}}, \quad (1)$$

$$Acc = \frac{1}{1 + G_{loop}} \cong \frac{V_{in_{FS}}}{G \cdot VDAC_{FS}} \text{ for } f \ll UGB, \quad (2)$$

$$UGB = \frac{f_C \cdot G \cdot VDAC_{FS}}{V_{in_{FS}}}, \quad (3)$$

where G denotes the amplifier's 112 gain, f is the frequency of the incoming analog signal, $f_C$ is the corner frequency of the AC coupler 102, $V_{DAC_{FS}}$ is the full scale voltage of the DAC 114, and $Vin_{FS}$ is the full scale voltage of the incoming analog signal determined by the ADC 104. The transceiver system 100 has an improved correction accuracy and can track any change that is caused by the technology process spread and temperature variations. This is because the amplitude and bandwidth of the baseline wander is dependent on the corner frequency $f_C$ which may vary as a result of the resistance and capacitance values spreading with the technology process and temperature.

Figure 2:
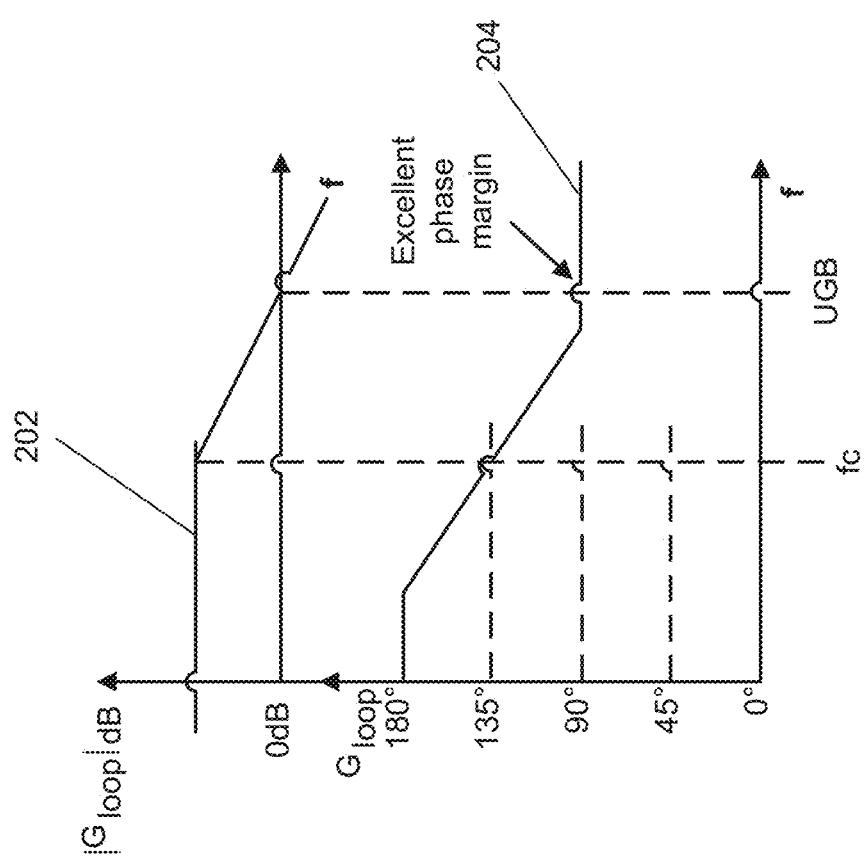
FIG. 2 is a Bode diagram depicting a loop gain as a function of frequency of an example transceiver system, according to one embodiment.

FIG. 2 is a Bode diagram depicting a loop gain as a function of frequency of an example transceiver system. The transceiver system has a corner frequency $f_C$ at 100 KHz, a ratio of the full scale voltage of the DAC 114 to the full scale voltage of the incoming analog signal at 0.2, and a digital gain G at 500. The curve 202 illustrates a magnitude of the loop gain and the curve 204 illustrates a phase of the loop gain. As illustrated, this particular transceiver system can suppress the effects of baseline wander up to 1% (40 dB) accuracy over a bandwidth of 10 MHz.

Figure 3:
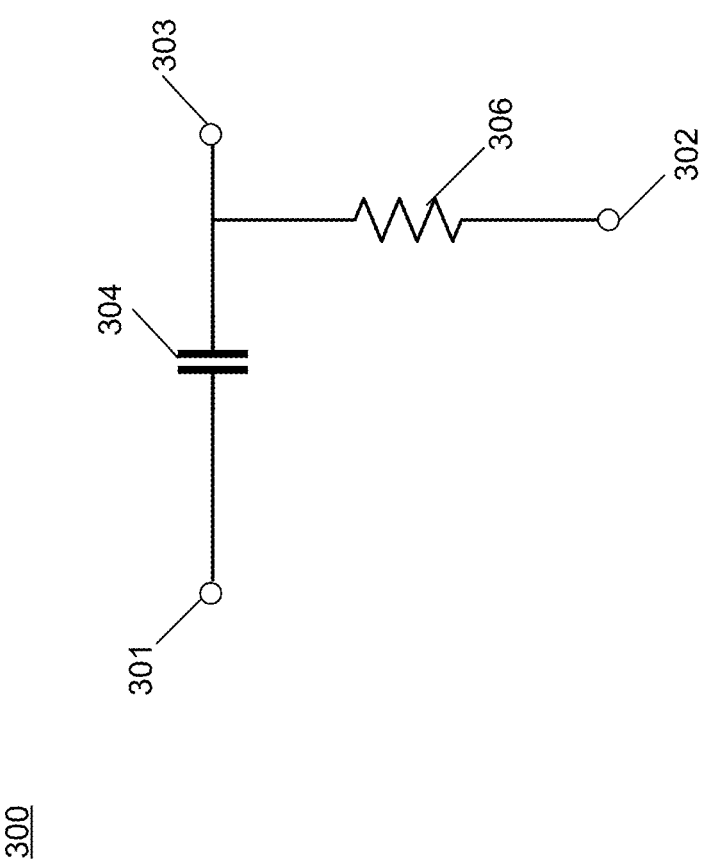
FIG. 3 is a circuit diagram implementing an AC coupler, a signal summation circuit, and a low pass filter for use in an example transceiver system, according to one embodiment.

FIG. 3 is a circuit diagram implementing an AC coupler, a signal summation circuit, and a low pass filter for use in an example transceiver system, according to one embodiment. As illustrated, the circuit 300 includes two input terminals 301, 302, an output terminal 303, a capacitor 304, and a resistor 306. The capacitor 304 is coupled between the input terminal 301 and the output terminal 303. The resistor 306 is coupled between the input terminal 302 and the output terminal 303. The circuit 300 performs the function of the AC coupler 102 as well as the low pass filter 116 because its frequency response from the terminal 301 to the terminal 303 is a high pass filter with the corner frequency $f_C$ that equals to the resistance of the resistor 306 times the capacitance of the capacitor 304. In operation, the circuit 300 receives the incoming data signal at the input terminal 301 and a low frequency AC signal or a DC signal at the input terminal 302, and outputs an output signal at the output terminal 303. The output signal is the sum of the signals received at the input terminals 301, 302. For example, the input terminals 301, 302 are coupled to the input terminal 101 and to the output terminal of the DAC 114, respectively. The circuit 300 directly implements the function of the low pass filter function 116. The corner frequency $f_C$ of the illustrated circuit diagram is provided in Equation (4):

$$f_c = \frac{1}{2\pi RC}, \quad (4)$$

where R denotes the resistance of the resistor 306, and C denotes the capacitance of the capacitor 304.

The transceiver system described herein reduces power consumption and thermal noise, and also eliminates the need to have ADCs with a wide dynamic range, compared to conventional transceiver systems that compensate for baseline wandering in the digital stage. ADCs included in the transceiver systems described herein convert analog signals of which the baseline wandering has been compensated. For example, for a baseline wandering that is 20% of the input analog signal, the transceiver system described herein reduces the ADC full scale by 20% or tolerates 20% more ADC input referred RMS noise for the same input signal amplitude, which contributes to 40% reduction in power consumption and thermal noise.

Compared to other transceiver systems that compensate for baseline wandering in the analog stage by using digital integrators, the transceiver system described herein has an improved phase margin and loop stability. This is because a digital integrator introduces a pole in the loop gain of transceiver system that may pose loop stability issues.

Figure 4:
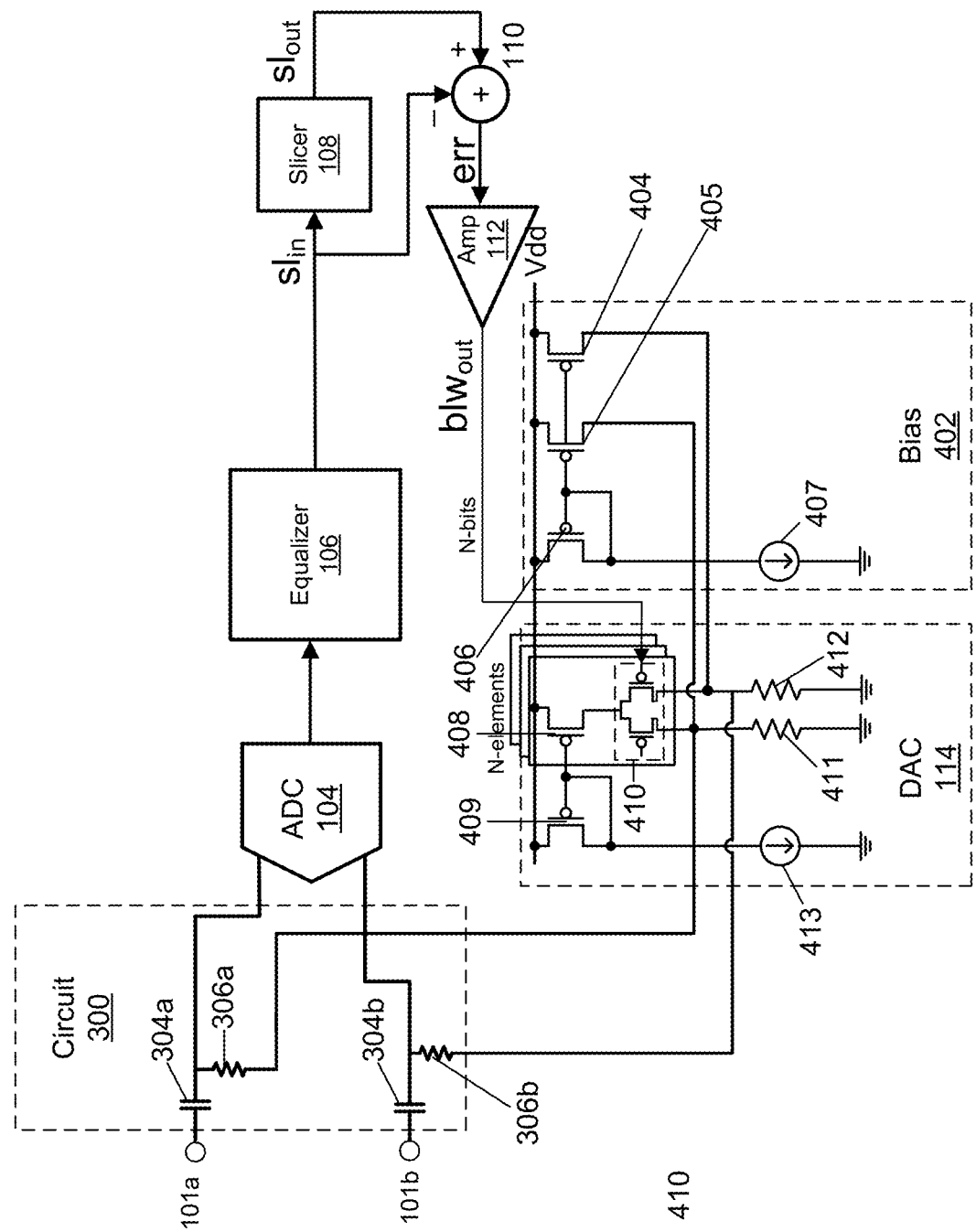
FIG. 4 is a block diagram of an example transceiver system, according to one embodiment.

FIG. 4 is a block diagram 400 of an example transceiver system, according to one embodiment. The example transceiver system 400 includes a pair of input terminals 101a, 101b that receives a differential pair of signals. Each of the input terminals 101a, 101b receives one of the differential pair of signals. The circuit 300 includes a pair of RC circuits that implements the AC couplers, signal summation circuits, and low pass filters for handling the differential pair of signals. In the illustrated example, the DAC 114 includes a plurality of transistors 408, a bias transistor 409, a plurality of differential pairs of transistors 410, a current source 413, and resistors 411, 412. The number of plurality transistors 408 or the number of differential pairs of transistors 410 equals to the number of digits of a binary N-bit word. The current source's 413 current value, the sizing of the transistors 408, 409, as well as the resistance of the resistors 411, 412 together determines the full scale voltage of the DAC 114.

The gate and the drain of the transistor 409 as well as the gate of the transistor 408 are connected to the current source 413. The sources of the transistors 408, 409 are connected to the power supply voltage. The drain of each transistor 408 is connected to the sources of a corresponding differential pair of transistors 410. The drains of the differential pairs of transistors 410 are coupled to the ground via the resistors 411, 412. The gates of the differential pairs of transistors 410 are coupled to the amplifier 112 and receive the corresponding data bit. The outputs of the differential pairs of transistors 410 are the outputs of the DAC 114.

Each of the transistors 408 functions as a current source and is sized according to the digital representation of the weight of the corresponding data bit provided by the digital amplifier 112. The differential pairs of transistors 410 each correspond to a data bit and steer the current flowing through the corresponding transistor 408 according to the data bit. Specifically, the gates of a differential pair of transistors 410 receive the corresponding digit from the amplifier 112, the sources of the differential pair of transistors 410 are coupled to the drain of the transistor 408, and the drains of the differential pair of transistors 410 are coupled to the resistors 411, 412, respectively. The resistors 411, 412 convert the current outputted from the differential pairs of transistors 410 to voltages.

The example transceiver system 400 further includes a bias circuit 402 that provides a pair of bias current to the DAC 114 to set the common mode of the DAC 114. The bias circuit 402 is a current source that includes transistors 404, 405, 406 and a current source 407. The gates of the transistors 404, 405, 406 are connected and the drain of the transistor 406 are connected to the current source 407. The sources of the transistors 404, 405, 406 are connected to the power supply voltage. The drains of the transistors 404, 405 are connected to the outputs of the differential amplifier 410, respectively.

Upon reading this disclosure, those of skill in the art will appreciate still additional alternative designs. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. A transceiver comprising:
an AC coupler to couple an input analog signal into the transceiver, a coupled analog signal including the input analog signal representing a series of symbols and a variation in a low frequency content of the input analog signal;
an analog to digital converter configured to convert an output signal of a baseline wandering compensation circuit to a digital signal;
a slicer configured to receive the digital signal and to determine the series of symbols;
the baseline wandering compensation circuit configured to determine an amount of the variation and to remove the variation from the coupled analog signal to generate the output signal, the baseline wandering compensation circuit comprising:
a subtraction block configured to determine a difference between an input of the slicer and an output of the slicer,
a digital to analog converter configured to convert the difference between the input of the slicer and the output of the slicer to an analog representation of the difference between the input of the slicer and the output of the slicer, the analog representation of the difference between the input of the slicer and the output of the slicer including the variation, and
a signal summation circuit to subtract the variation from the coupled analog signal.

2. The transceiver of claim 1, wherein the baseline wandering compensation circuit further includes a low pass filter configured to extract the low frequency content from the output of the digital to analog converter.

3. The transceiver of claim 1, wherein the baseline wandering compensation circuit further comprises a digital amplifier configured to amplify the difference between the input of the slicer and the output of the slicer.

4. The transceiver of claim 1, wherein the AC coupler comprises a capacitor and the signal summation circuit comprises a resistor, a first terminal of the capacitor is coupled to the input terminal of the transceiver, a second terminal of the capacitor is coupled to a first terminal of the resistor that is coupled to an input of the analog to digital converter, and a second terminal of the resistor is coupled to an output of the digital to analog converter.

5. The transceiver of claim 1, wherein the digital to analog converter comprises a first transistor, a plurality of second transistors, a current source, a plurality of differential pairs of transistors, a first resistor, and a second resistor, wherein a gate of the first transistor, a drain of the first transistor, and gates of the plurality of second transistors are connected to the current source, a drain of each second transistor is connected to sources of a corresponding differential pair of transistors, and drains of each differential pair of transistors are connected to the first and second resistors, respectively.

6. The transceiver of claim 5, wherein gates of each differential pair of transistors receive a corresponding bit of the difference between the input of the slicer and the output of the slicer.

7. The transceiver of claim 6, wherein each second transistor is sized according to the corresponding bit.

8. The transceiver of claim 1, wherein the baseline wandering compensation circuit further comprises a bias current to provide a common mode bias current to the digital to analog converter.

* * * * *